(12) United States Patent
Park et al.

(10) Patent No.: US 12,047,081 B2
(45) Date of Patent: Jul. 23, 2024

(54) SLEW RATE CONTROL CIRCUIT CAPABLE OF PROVIDING STABLE PERFORMANCE AND STABLE DUTY CYCLE

(71) Applicant: Fujian Jinhua Integrated Circuit Co., Ltd., Quanzhou (CN)

(72) Inventors: Minho Park, Quanzhou (CN); Chul Soo Kim, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 1 day.

(21) Appl. No.: 18/133,535

(22) Filed: Apr. 12, 2023

(65) Prior Publication Data

US 2024/0128959 A1   Apr. 18, 2024

(30) Foreign Application Priority Data

Oct. 18, 2022   (CN) .......................... 202211277143.8
Oct. 18, 2022   (CN) .......................... 202222745953.3

(51) Int. Cl.
*H03K 5/06* (2006.01)
*H03K 5/133* (2014.01)
*H03K 5/156* (2006.01)
*H03K 19/20* (2006.01)

(52) U.S. Cl.
CPC .............. *H03K 5/06* (2013.01); *H03K 5/133* (2013.01); *H03K 5/1565* (2013.01); *H03K 19/20* (2013.01)

(58) Field of Classification Search
None
See application file for complete search history.

(56) References Cited

U.S. PATENT DOCUMENTS

| 8,519,761 | B1 * | 8/2013 | Kossel | H03K 5/13 327/170 |
| 9,647,657 | B1 * | 5/2017 | Bryson | H02J 7/345 |
| 11,967,958 | B2 * | 4/2024 | Chen | H03K 19/20 |

* cited by examiner

*Primary Examiner* — Cassandra F Cox
(74) *Attorney, Agent, or Firm* — Winston Hsu

(57) ABSTRACT

The slew rate control circuit includes a slew rate control unit, a capacitive delay unit, a delay unit, a first output unit, a second output unit, and a third output unit. The slew rate control unit is used for receiving a plurality of control voltages. The capacitive delay unit is coupled to the slew rate control unit for receiving an input signal. The delay unit is coupled to the capacitive delay unit. The first output unit and the second output unit are coupled to the capacitive delay unit. The third output unit is coupled to the delay unit. The first output signal and the second output signal are two signals without controllable slew rates. A slew rate of the third output signal is controlled by the capacitive delay unit. A slew rate of the fourth output signal is controlled by the capacitive delay unit and the delay unit.

10 Claims, 8 Drawing Sheets

SLEW RATE CONTROL CIRCUIT CAPABLE OF PROVIDING STABLE PERFORMANCE AND STABLE DUTY CYCLE

BACKGROUND OF THE INVENTION

1. Field of the Invention

The present invention illustrates a slew rate control circuit, and more particularly, a slew rate control circuit capable of providing stable performance and stable duty cycle.

2. Description of the Prior Art

With the rapid development of technology, various volatile and non-volatile memory components are used in computer systems. Dynamic random access memory (DRAM) is a semiconductor memory categorized as a volatile memory. The DRAM can use a plurality of charges stored in a capacitor for indicating if a binary bit logic is 1 or 0. The DRAM can be regarded as a short-term data storage unit of the computer system. Since the DRAM can be used for saving data currently used, the data currently used can be quickly accessed by the computer system.

Further, the DRAM can provide high-speed data transmission capability and high bandwidth utilization. However, the high-speed data transmission capability and high bandwidth utilization cause an electromagnetic interference (EMI) effect. The EMI interference effect decreases DRAM performance. Generally, EMI problems can be mitigated by controlling a slew rate of data. In a conventional DRAM output data buffer circuit, the slew rate can be adjusted. Specifically, when the slew rate is increased, a maximum rate of variation of the output voltage per unit period is increased. As a result, a charging speed of the capacitor is increased. On the contrary, when the slew rate is decreased, the maximum rate of variation of the output voltage per unit period is decreased. As a result, the charging speed of the capacitor is decreased. However, a performance disturbance effect may be introduced when the slew rate is controlled by the conventional DRAM output data buffer circuit.

Therefore, to develop a slew rate control circuit for adjusting the slew rate while maintaining a signal duty cycle without introducing the performance disturbance effect is an important design issue.

SUMMARY OF THE INVENTION

In an embodiment of the present invention, a slew rate control circuit is disclosed. The slew rate control circuit comprises a slew rate control unit, a capacitive delay unit, a delay unit, a first output unit, a second output unit, and a third output unit. The slew rate control unit comprises a first input terminal configured to receive a first control signal, a second input terminal configured to receive a second control signal, a third input terminal configured to receive a third control signal, and an output terminal configured to output a plurality of control voltages. The capacitive delay unit is coupled to the slew rate control unit and configured to receive an input signal. The delay unit is coupled to the capacitive delay unit. The first output unit comprises an input terminal coupled to the capacitive delay unit and configured to receive the input signal, a first output terminal configured to output a first output signal, and a second output terminal configured to output a second output signal. The second output unit comprises a first input terminal coupled to the capacitive delay unit and configured to receive an output of the capacitive delay unit, a second input terminal configured to receive the second control signal, and an output terminal configured to output a third output signal. The third output unit comprises a first input terminal coupled to the delay unit and configured to receive an output of the delay unit, a second input terminal configured to receive the third control signal, and an output terminal configured to output a fourth output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
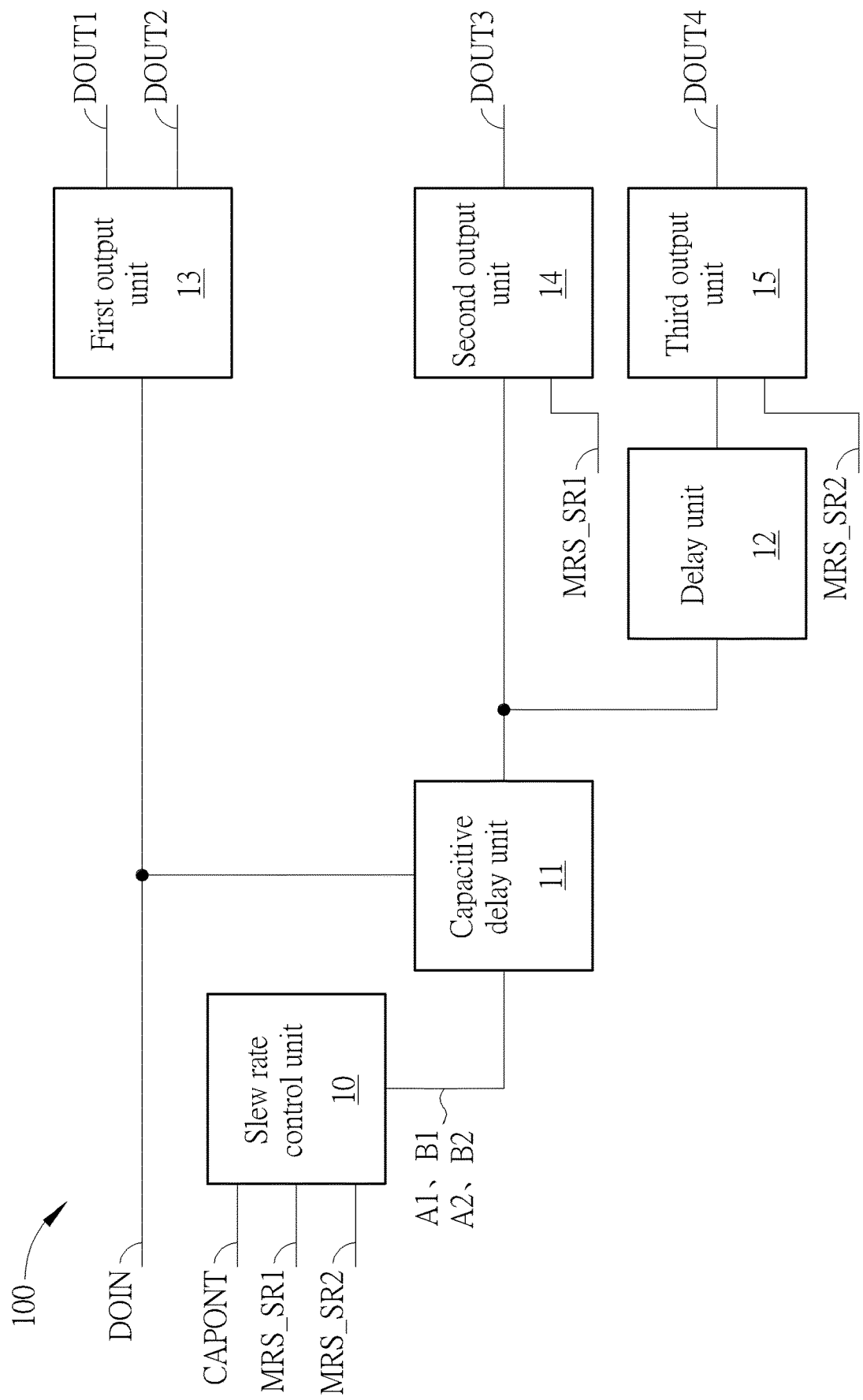
FIG. 1 is a block diagram of a slew rate control circuit according to an embodiment of the present invention.

FIG. 1 is a block diagram of a slew rate control circuit 100 according to an embodiment of the present invention. The slew rate control circuit 100 is used to adjust a slew rate and maintain a signal duty cycle without introducing a performance disturbance effect. Details of the slew rate control circuit 100 are illustrated below. The slew rate control circuit 100 includes a slew rate control unit 10, a capacitive delay unit 11, a delay unit 12, a first output unit 13, a second output unit 14, and a third output unit 15. The slew rate control unit 10 includes a first input terminal, a second input terminal, a third input terminal, and an output terminal. The first input terminal is used for receiving a first control signal CAPONT. The second input terminal is used for receiving a second control signal MRS_SR1. The third input terminal is used for receiving a third control signal MRS_SR2. The output terminal is used for outputting a plurality of control voltages A1, B1, A2, and B2. The capacitive delay unit 11 is coupled to the slew rate control unit 10 for receiving an input signal DOIN and receiving the plurality of control voltages A1, B1, A2, and B2 outputted by the slew rate control unit 10. The delay unit 12 is coupled to the capacitive delay unit 11. The first output unit 13 includes an input terminal, a first output terminal, and a second output terminal. The input terminal is coupled to the capacitive delay unit 11 for receiving the input signal DOIN. The first output terminal is used for outputting a first output signal DOUT1. The second output terminal is used for outputting a second output signal DOUT2. The second output unit 14 includes a first input terminal, a second input terminal, and an output terminal. The first input terminal is coupled to the capacitive delay unit 11 for receiving the output of the capacitive delay unit 11. The second input terminal is used for receiving the second control signal MRS_SR1. The output terminal is used for outputting a third output signal DOUT3. The third output unit 15 includes a first input terminal, a second input terminal, and an output terminal. The first input terminal is coupled to the delay unit 12 for receiving the output of the delay unit 12. The second input terminal is used for receiving the third control signal MRS_SR2. The output terminal is used for outputting a fourth output signal DOUT4. In the slew rate control circuit 100, the first output signal DOUT1 and the second output signal DOUT2 outputted from the first output unit 13 are two signals without controllable slew rates. A slew rate of the third output signal DOUT3 outputted from the second output unit 14 can be controlled by the capacitive delay unit 11. A slew rate of the fourth output signal DOUT4 outputted from the third output unit 15 can be controlled by the capacitive delay unit 11 and the delay unit 12.

In other words, the slew rate control circuit 100 can control the slew rate of signals under various modes. Further, the slew rate control circuit 100 can maintain the signal duty cycle when the slew rate is adjusted under the various modes. Circuit details of the slew rate control circuit 100 are illustrated later.

Figure 2:
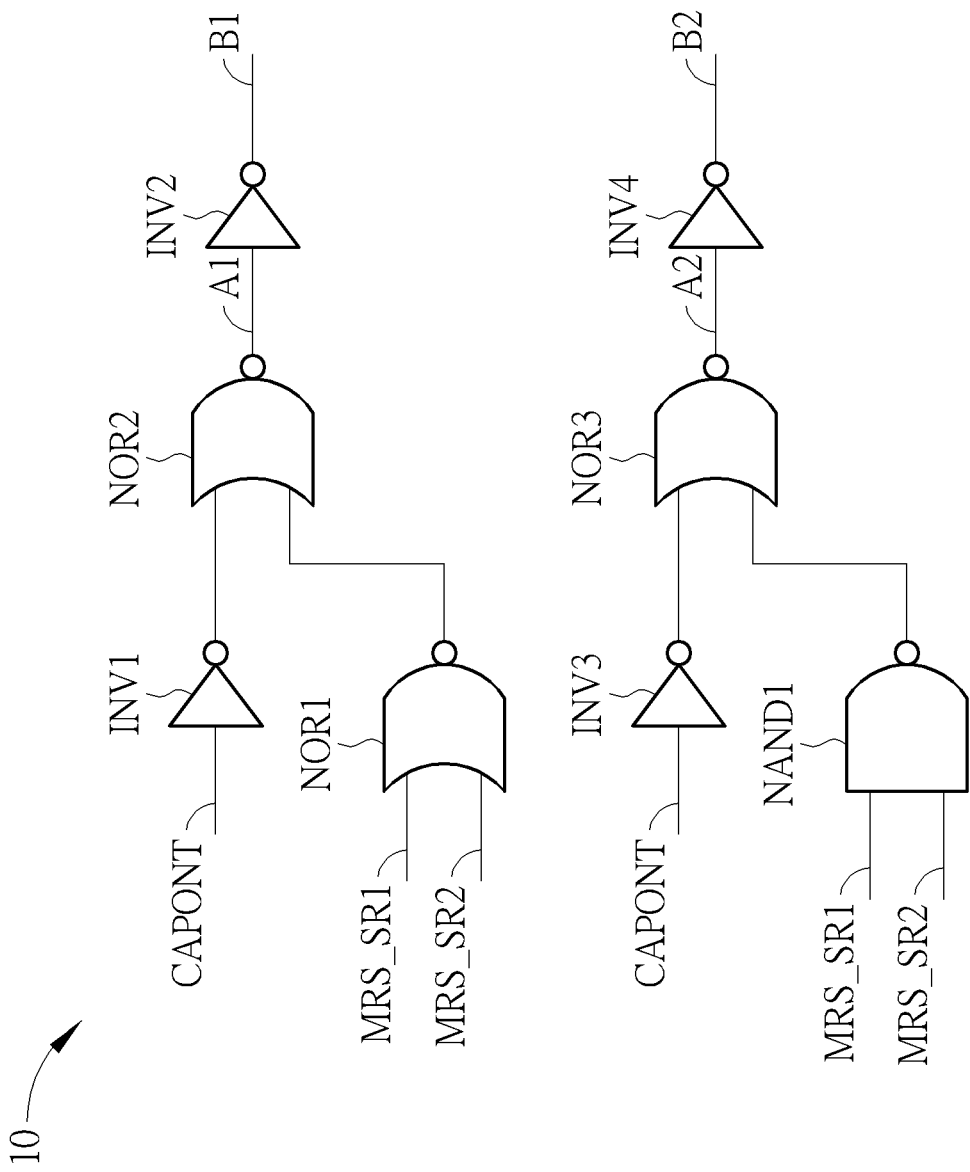
FIG. 2 is a structure of a slew rate control unit of the slew rate control circuit in FIG. 1.

FIG. 2 is a structure of a slew rate control unit 10 of the slew rate control circuit 100. The slew rate control unit 10 includes a first inverter INV1, a first NOR gate NOR1, a second NOR gate NOR2, a second inverter INV2, a third inverter INV3, a first NAND gate NAND1, a third NOR gate NOR3, and a fourth inverter INV4. The first inverter INV1 includes an input terminal and an output terminal. The input terminal is used for receiving the first control signal CAPONT. The first NOR gate NOR1 includes a first input terminal, a second input terminal and an output terminal. The first input terminal is used for receiving the second control signal MRS_SR1. The second input terminal is used for receiving the third control signal MRS_SR2. The second NOR gate NOR2 includes a first input terminal, a second input terminal, and an output terminal. The first input terminal is coupled to the output terminal of the first inverter INV1. The second input terminal is coupled to the output terminal of the first NOR gate NOR1. The second inverter INV2 includes an input terminal and an output terminal. The input terminal is coupled to the output terminal of the second NOR gate NOR2. Further, the output terminal of the second NOR gate NOR2 can output the control voltage A1. The output terminal of the second inverter INV2 can output the control voltage B1. The control voltage A1 and the control voltage B1 are complementary. The third inverter INV3 includes an input terminal and an output terminal. The input terminal is used for receiving the first control signal CAPONT. The first NAND gate NAND1 includes a first input terminal, a second input terminal, and an output terminal. The first input terminal is used for receiving the second control signal MRS_SR1. The second input terminal is used for receiving the third control signal MRS_SR2. The third NOR gate NOR3 includes a first input terminal, a second input terminal, and an output terminal. The first input terminal is coupled to the output terminal of the third inverter INV3. The second input terminal is coupled to the output terminal of the first NAND gate NAND1. The fourth inverter INV4 includes an input terminal and an output terminal. The input terminal is coupled to the output terminal of the third NOR gate NOR3. Further, the output terminal of the third NOR gate NOR3 can output the control voltage A2. The output terminal of the fourth inverter INV4 can output the control voltage B2. The control voltage A2 and the control voltage B2 have opposite phases. In the slew rate control unit 10, input signals include the first control signal CAPONT, the second control signal MRS_SR1, and the third control signal MRS_SR2. Output signals include the control voltage A1, the control voltage B1, the control voltage A2, and the control voltage B2. Correlations between the input signals and the output signals of the slew rate control unit 10 can be illustrated below.

TABLE T1

| CAPONT | MRS_SR1 | MRS_SR2 | A1 | B1 |
|--------|---------|---------|----|----|
| L | L | L | L | H |
| L | L | H | L | H |
| L | H | L | L | H |
| L | H | H | L | H |
| H | L | L | L | H |
| H | L | H | H | L |
| H | H | L | H | L |
| H | H | H | H | L |

TABLE T2

| CAPONT | MRS_SR1 | MRS_SR2 | A2 | B2 |
|--------|---------|---------|----|----|
| L | L | L | L | H |
| L | L | H | L | H |
| L | H | L | L | H |
| L | H | H | L | H |
| H | L | L | L | H |
| H | L | H | L | H |
| H | H | L | L | H |
| H | H | H | H | L |

Here, "L" is denoted as a low voltage. "H" is denoted as a high voltage. In the slew rate control unit 10, according to Table 1 and Table 2, when the first control signal CAPONT, the second control signal MRS_SR1, and the third control signal MRS_SR2 are adjusted, the control voltages A1, A2, B1, and B2 of the slew rate control unit 10 are also changed.

Figure 3:
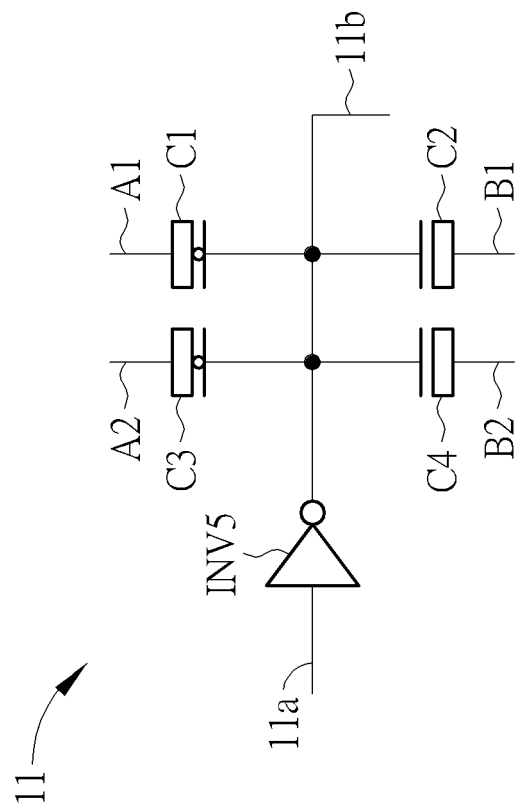
FIG. 3 is a structure of a capacitive delay unit of the slew rate control circuit in FIG. 1.

FIG. 3 is a structure of a capacitive delay unit 11 of the slew rate control circuit 100. A definition of the slew rate is an increasing rate or a decreasing rate of the voltage during a time period. Generally, the increasing rate can be defined as the voltage rising time duration from a valley to a peak of a waveform. Since a capacitor is capable of charging and discharging power, the capacitive delay unit 11 can be used for controlling the slew rate. The capacitive delay unit 11 includes a fifth inverter INV5, a first capacitor C1, a second capacitor C2, a third capacitor C3, and a fourth capacitor C4. The fifth inverter INV5 includes an input terminal 11a and an output terminal 11b. The input terminal 11a is used for receiving the input signal DOIN. The first capacitor C1 includes a first terminal and a second terminal. The first terminal is coupled to the output terminal of the second NOR gate NOR2 for receiving the control voltage A1. The second terminal is coupled to the output terminal 11b of the fifth inverter INV5. The second capacitor C2 includes a first terminal and a second terminal. The first terminal is coupled to the output terminal of the second inverter INV2 for receiving the control voltage B1. The second terminal is coupled to the output terminal 11b of the fifth inverter INV5. The third capacitor C3 includes a first terminal and a second terminal. The first terminal is coupled to the output terminal of the third NOR gate NOR3 for receiving the control voltage A2. The second terminal is coupled to the output terminal 11b of the fifth inverter INV5. The fourth capacitor C4 includes a first terminal and a second terminal. The first terminal is coupled to the output terminal of the fourth inverter INV4 for receiving the control voltage B2. The second terminal is coupled to the output terminal 11b of the fifth inverter INV5. Specifically, the first capacitor C1, the second capacitor C2, the third capacitor C3, and the fourth capacitor C4 can individually generate a charging path or a discharging path to the output terminal 11b of the fifth inverter INV5. Therefore, the slew rate control circuit 100 can adjust a voltage boosting rate and a voltage dropping rate of the output terminal 11b of the fifth inverter INV5 during a time period. By doing so, the slew rate of the output terminal 11b of the fifth inverter INV5 can be controlled. Here, the first capacitor C1, the second capacitor C2, the third capacitor C3, and the fourth capacitor C4 can be polarized capacitors. As mentioned above, in the slew rate control unit 10, when the first control signal CAPONT, the second control signal MRS_SR1, and the third control signal MRS_SR2 are adjusted, the control voltages A1, A2, B1, and, B2 are also changed. Therefore, the control voltages A1, A2, B1, and B2 of the slew rate control unit 10 can control a voltage of the output terminal 11b of the fifth inverter INV5 through the first capacitor C1, the second capacitor C2, the third capacitor C3, and the fourth capacitor C4. For example, if a part of power of the output terminal 11b of the fifth inverter INV5 is used for charging the capacitors C1, C2, C3, C4, the voltage of the output terminal 11b of the fifth inverter INV5 is decreased. If the capacitors C1, C2, C3 and/or C4 are discharged and output power to the output terminal 11b of the fifth inverter INV5, the voltage of the output terminal 11b of the fifth inverter INV5 is increased. Further, the first capacitor C1, the second capacitor C2, the third capacitor C3, and the fourth capacitor C4 can be Metal-Oxide-Semiconductor Capacitors (MOS Capacitors). Any reasonable technology or hardware modification falls into the scope of the present invention.

Figure 4:
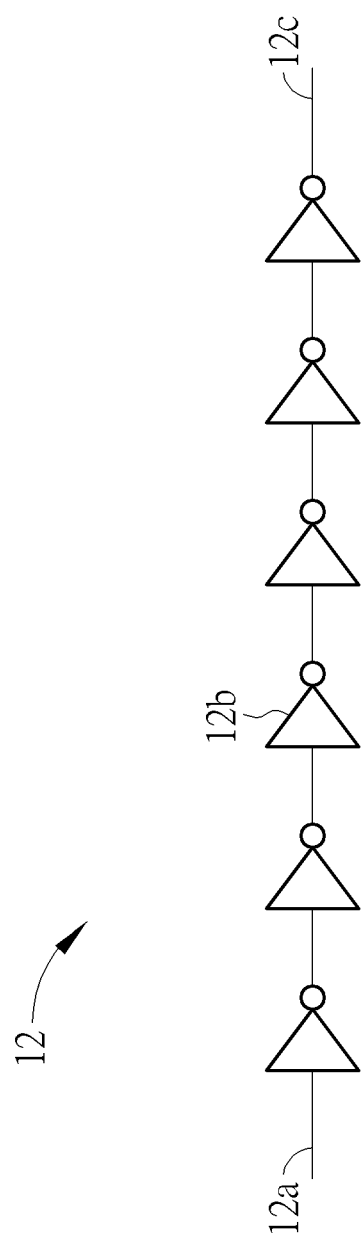
FIG. 4 is a structure of a delay unit of the slew rate control circuit in FIG. 1.

FIG. 4 is a structure of a delay unit 12 of the slew rate control circuit 100. The delay unit 12 can include a plurality of inverters 12b. The plurality of inverters 12b can be coupled in series. The delay unit 12 can include an input terminal 12a and an output terminal 12c. The input terminal 12a of the delay unit 12 is coupled to the capacitive delay unit 11. The output terminal 12c of the delay unit 12 is coupled to the third output unit 15. Here, each inverter 12b of the delay unit 12 causes a signal delay effect. The number of inverters 12b connected in series in the delay unit 12 is not limited. Further, since the delay unit 12 delays a voltage waveform, timing points for boosting the voltage and dropping the voltage of the output terminal 11b of the fifth inverter INV5 can be delayed. In other words, the slew rate control circuit 100 can further reduce the slew rate after the delay unit 12 is introduced.

Figure 5:
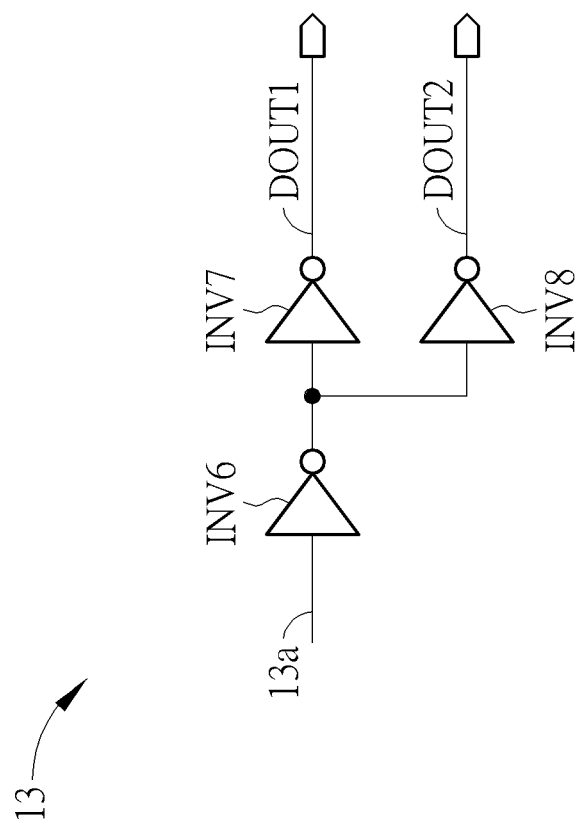
FIG. 5 is a structure of a first output unit of the slew rate control circuit in FIG. 1.

FIG. 5 is a structure of a first output unit 13 of the slew rate control circuit 100. The first output unit 13 includes a sixth inverter INV6, a seventh inverter INV7, and an eighth inverter INV8. The sixth inverter INV6 includes an input terminal 13a and an output terminal. The input terminal 13a is used for receiving the input signal DOIN. The seventh inverter INV7 includes an input terminal and an output terminal. The input terminal is coupled to the output terminal of the sixth inverter INV6. The output terminal is used for outputting the first output signal DOUT1. The eighth inverter INV8 includes an input terminal and an output terminal. The input terminal is coupled to the output terminal of the sixth inverter INV6. The output terminal is used to output the second output signal DOUT2. In the first output unit 13, the first output signal DOUT1 and the second output signal DOUT2 are generated by receiving the input signal DOIN through two inverters. Therefore, phases of the first output signal DOUT1 and the second output signal DOUT2 are identical. Further, the first output signal DOUT1 and the second output signal DOUT2 can be regarded as the input signal DOIN being slightly delayed by two inverters. Therefore, waveforms of the first output signal DOUT1, the second output signal DOUT2, and the input signal DOIN are almost identical. Therefore, the first output signal DOUT1 and the second output signal DOUT2 are two signals without controllable slew rates.

Figure 6:
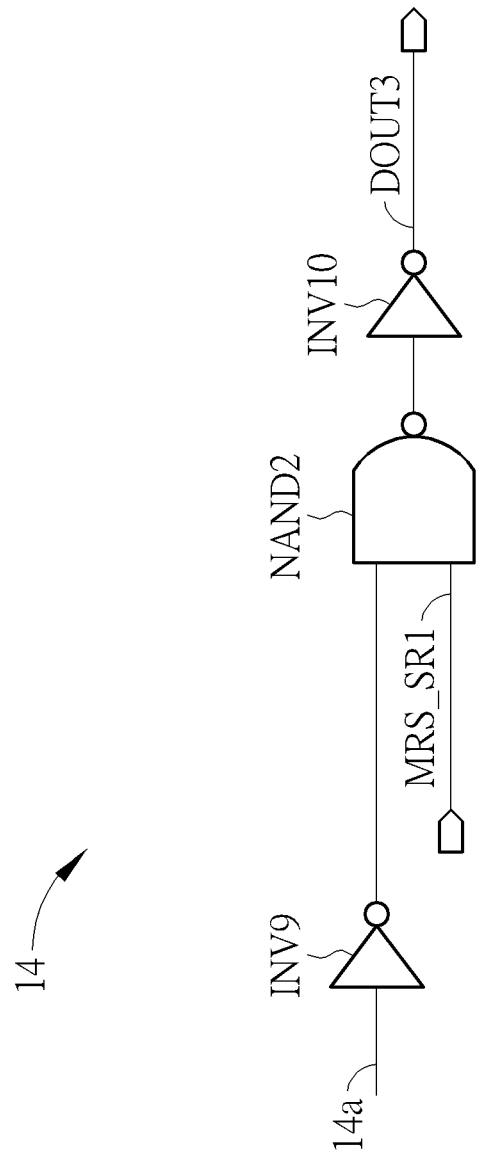
FIG. 6 is a structure of a second output unit of the slew rate control circuit in FIG. 1.

FIG. 6 is a structure of a second output unit 14 of the slew rate control circuit 100. The second output unit 14 includes a ninth inverter INV9, a second NAND gate NAND2, and a tenth inverter INV10. The ninth inverter INV9 includes an input terminal 14a and an output terminal. The input terminal 14a is coupled to the capacitive delay unit 11. The second NAND gate NAND2 includes a first input terminal and a second input terminal. The first input terminal is coupled to the output terminal of the ninth inverter INV9. The second input terminal is used for receiving the second control signal MRS_SR1. The tenth inverter INV10 includes an input terminal and an output terminal. The input terminal is coupled to the output terminal of the second NAND gate NAND2. The output terminal is used for outputting the third output signal DOUT3. Corrections among a voltage of the input terminal 14a, the second control signal MRS_SR1, and the third output signal DOUT3 are illustrated below.

TABLE T3

| input terminal 14a | MRS_SR1 | DOUT3 |
|---|---|---|
| L | L | L |
| L | H | H |
| H | L | L |
| H | H | L |

Here, "L" is denoted as the low voltage. "H" is denoted as the high voltage. In Table T3, when the second control signal MRS_SR1 is disabled "L", the third output signal DOUT3 is always at a low voltage "L". When the second control signal MRS_SR1 is enabled "H", phases between the third output signal DOUT3 and the voltage of the input terminal 14a opposite. However, phases between the voltage of the input terminal 14a and the input signal DOIN are opposite (through the fifth inverter 11a). Therefore, when the second control signal MRS_SR1 is enabled "H", phases between the third output signal DOUT3 and the input signal DOIN are identical. In other words, the second control signal MRS_SR1 can be regarded as an activation signal of the second output unit 14. When the second output unit 14 is enabled, a slew rate of the third output signal DOUT3 is controlled by the capacitive delay unit 11.

Figure 7:
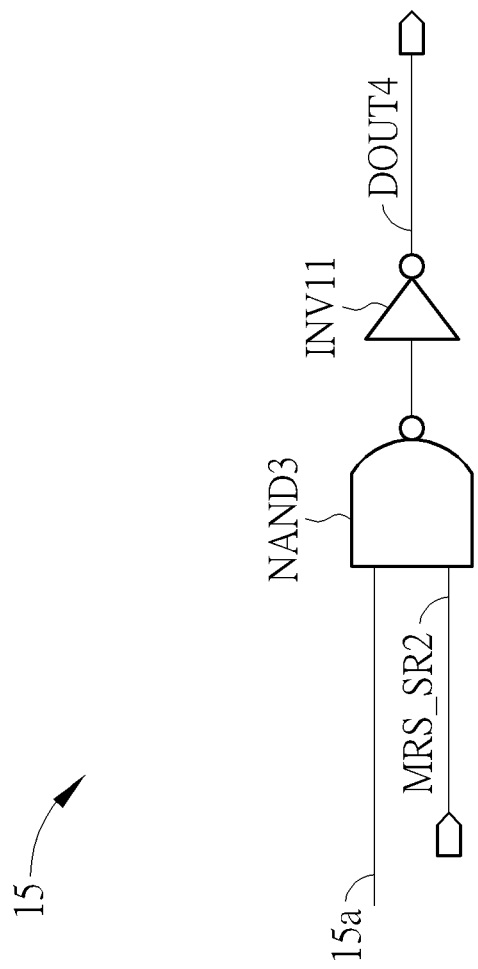
FIG. 7 is a structure of a third output unit of the slew rate control circuit in FIG. 1.

FIG. 7 is a structure of a third output unit 15 of the slew rate control circuit 100. The third output unit 15 includes a third NAND gate NAND3 and an eleventh inverter INV11. The third NAND gate NAND3 includes a first input terminal, a second input terminal, and an output terminal. The first input terminal is denoted as 15a. The first input terminal 15a is coupled to the delay unit 12. The second input terminal is used for receiving the third control signal MRS_SR2. The eleventh inverter INV11 includes an input terminal and an output terminal. The input terminal is coupled to the output terminal of the third NAND gate NAND3. The output terminal is used for outputting the fourth output signal DOUT4. Operation modes of the third output unit 15 are similar to the second output unit 14. Thus, details are omitted here. In the third output unit 15, the third control signal MRS_SR2 can be regarded as an activation signal of the third output unit 15. When the third output unit 15 is enabled, a slew rate of the fourth output signal DOUT4 is controlled by the capacitive delay unit 11 and the delay unit 12.

Figure 8:
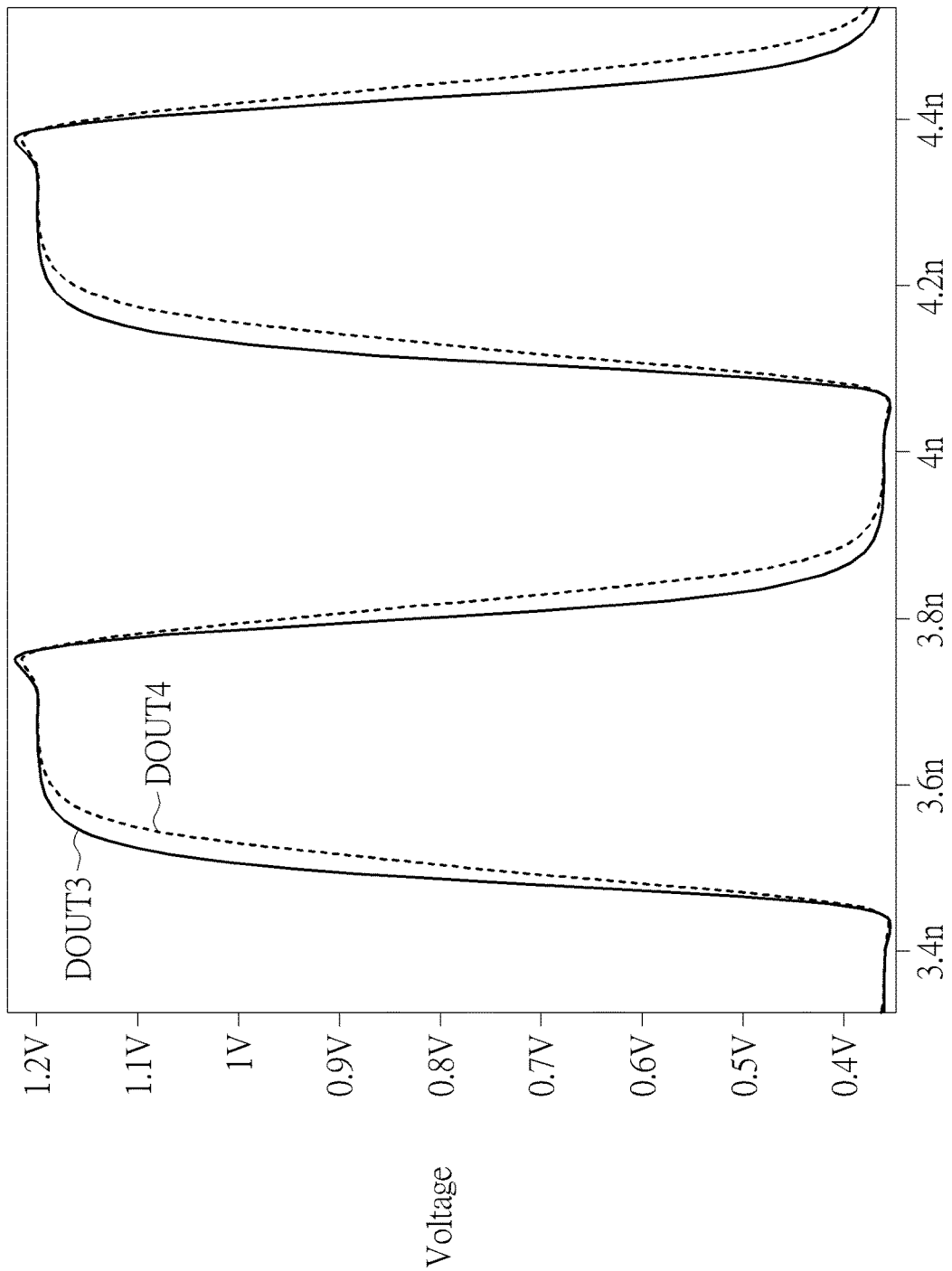
FIG. 8 illustrates signal waveforms of a third output signal and a fourth output signal of the slew rate control circuit in FIG. 1.

FIG. 8 illustrates signal waveforms of the third output signal DOUT3 and the fourth output signal DOUT4 of the slew rate control circuit 100. As mentioned previously, the slew rate of the third output signal DOUT3 is controlled by the capacitive delay unit 11. The slew rate of the fourth output signal DOUT4 is controlled by the capacitive delay unit 11 and the delay unit 12. Therefore, in FIG. 8, when the capacitive delay unit 11 and the delay unit 12 are enabled by the first control signal CAPONT, the second control signal MRS_SR1, and the third control signal MRS_SR2, a voltage boosting waveform and a voltage dropping waveform of the fourth output signal DOUT4 are delayed. As a result, a voltage boosting speed of the fourth output signal DOUT4 is lower than a voltage boosting speed of the third output signal DOUT3. A voltage dropping speed of the fourth output signal DOUT4 is lower than a voltage dropping speed of the third output signal DOUT3. In other words, the slew rate of the fourth output signal DOUT4 is lower than the slew rate of the third output signal DOUT3. For example, in FIG. 8, the slew rate of the fourth output signal DOUT4 is 22% lower than the slew rate of the third output signal DOUT3. However, in the waveforms of the third output signal DOUT3 and the fourth output signal DOUT4 in FIG. 8, a difference between the duty cycle of the third output signal DOUT3 and the duty cycle of the fourth output signal DOUT4 is less than 5%. For example, in FIG. 8, the duty cycle of the third output signal DOUT3 is 50.72%. The duty cycle of the fourth output signal DOUT4 is 50.82%. In other words, the duty cycle of the third output signal DOUT3 is substantially equal to the duty cycle of the fourth output signal DOUT4. Therefore, for the slew rate control circuit 100, although the slew rate can be adjusted (for example, down control), the variation of the duty cycle can be mitigated. As a result, the stability of data output performance can be maintained.

To sum up, the present invention illustrates a slew rate control circuit. The slew rate control circuit can provide various modes for DRAM applications. The slew rate control circuit can provide a signal with a controllable slew rate. For example, the slew rate of the signal can be controlled by the capacitive delay unit. The slew rate of the signal can be controlled by the capacitive delay unit and the delay unit. The delay unit can be introduced into the slew rate control circuit. Therefore, the slew rate can be further adjusted (for example, down control). Further, when the slew rate is adjusted, since the variation of the duty cycle can be mitigated, the stability of data output performance can be maintained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slew rate control circuit comprising:
    a slew rate control unit comprising:
        a first input terminal configured to receive a first control signal;
        a second input terminal configured to receive a second control signal;
        a third input terminal configured to receive a third control signal; and
        an output terminal configured to output a plurality of control voltages;
    a capacitive delay unit coupled to the slew rate control unit and configured to receive an input signal;
    a delay unit coupled to the capacitive delay unit;
    a first output unit comprising:
        an input terminal coupled to the capacitive delay unit and configured to receive the input signal;
        a first output terminal configured to output a first output signal; and
        a second output terminal configured to output a second output signal;
    a second output unit comprising:
        a first input terminal coupled to the capacitive delay unit and configured to receive an output of the capacitive delay unit;
        a second input terminal configured to receive the second control signal; and
        an output terminal configured to output a third output signal; and
    a third output unit comprising:
        a first input terminal coupled to the delay unit and configured to receive an output of the delay unit;
        a second input terminal configured to receive the third control signal; and
        an output terminal configured to output a fourth output signal.

2. The circuit of claim 1, wherein the slew rate control unit further comprises:
    a first inverter comprising:
        an input terminal configured to receive the first control signal; and
        an output terminal;
    a first NOR gate comprising:
        a first input terminal configured to receive the second control signal;
        a second input terminal configured to receive the third control signal; and
        an output terminal;
    a second NOR gate comprising:
        a first input terminal coupled to the output terminal of the first inverter;
        a second input terminal coupled to the output terminal of the first NOR gate; and
        an output terminal;
    a second inverter comprising:
        an input terminal coupled to the output terminal of the second NOR gate; and
        an output terminal;
    a third inverter comprising:
        an input terminal configured to receive the first control signal; and
        an output terminal;
    a first NAND gate comprising:
        a first input terminal configured to receive the second control signal;
        a second input terminal configured to receive the third control signal; and
        an output terminal;
    a third NOR gate comprising:
        a first input terminal coupled to the output terminal of the third inverter;
        a second input terminal coupled to the output terminal of the first NAND gate; and
        an output terminal; and a fourth inverter comprising:
  an input terminal coupled to the output terminal of the third NOR gate; and
  and output terminal.

3. The circuit of claim 2, wherein the capacitive delay unit comprises:
  a fifth inverter comprising:
    an input terminal configured to receive the input signal; and
    an output terminal;
  a first capacitor comprising:
    a first terminal coupled to the output terminal of the second NOR gate; and
    a second terminal coupled to the output terminal of the fifth inverter;
  a second capacitor comprising:
    a first terminal coupled to the output terminal of the second inverter; and
    a second terminal coupled to the output terminal of the fifth inverter;
  a third capacitor comprising:
    a first terminal coupled to the output terminal of the third NOR gate; and
    a second terminal coupled to the output terminal of the fifth inverter; and
  a fourth capacitor comprising:
    a first terminal coupled to the output terminal of the fourth inverter; and
    a second terminal coupled to the output terminal of the fifth inverter.

4. The circuit of claim 3, wherein the first capacitor, the second capacitor, the third capacitor, and the fourth capacitor are Metal-Oxide-Semiconductor capacitors.

5. The circuit of claim 1, wherein the delay unit comprises a plurality of inverters, the plurality of inverters are coupled in series, and the delay unit comprises an input terminal and an output terminal, the input terminal of the delay unit is coupled to the capacitive delay unit, and the output terminal of the delay unit is coupled to the third output unit.

6. The circuit of claim 1, wherein the first output unit further comprises:
  a sixth inverter comprising:
    an input terminal configured to receive the input signal; and
    an output terminal;
  a seventh inverter comprising:
    an input terminal coupled to the output terminal of the sixth inverter; and
    an output terminal configured to output the first output signal; and
  an eighth inverter comprising:
    an input terminal coupled to the output terminal of the sixth inverter; and
    an output terminal configured to output the second output signal.

7. The circuit of claim 1, wherein the second output unit further comprises:
  a ninth inverter comprising:
    an input terminal coupled to the capacitive delay unit; and
    an output terminal;
  a second NAND gate comprising:
    a first input terminal coupled to the output terminal of the ninth inverter;
    a second input terminal configured to receive the second control signal; and
    an output terminal; and
  a tenth inverter comprising:
    an input terminal coupled to the output terminal of the second NAND gate; and
    an output terminal configured to output the third output signal.

8. The circuit of claim 1, wherein the third output unit comprises:
  a third NAND gate comprising:
    a first input terminal coupled to the delay unit;
    a second input terminal configured to receive the third control signal; and
    an output terminal;
  an eleventh inverter comprising:
    an input terminal coupled to the output terminal of the third NAND gate; and
    an output terminal configured to output the fourth output signal.

9. The circuit of claim 1, wherein the first output signal and the second output signal are two signals without controllable slew rates, a slew rate of the third output signal is controlled by the capacitive delay unit, and a slew rate of the fourth output signal is controlled by the capacitive delay unit and the delay unit.

10. The circuit of claim 1, when the capacitive delay unit and the delay unit are enabled by the first control signal, the second control signal, and the third control signal, a voltage boosting speed of the fourth output signal is lower than a voltage boosting speed of the third output signal, a voltage dropping speed of the fourth output signal is lower than a voltage dropping speed of the third output signal, and a duty cycle of the third output signal is substantially equal to a duty cycle of the fourth output signal.

* * * * *